United States Patent
Park et al.

(10) Patent No.: US 8,466,554 B2
(45) Date of Patent: Jun. 18, 2013

(54) ELECTRONIC DEVICE HAVING INTERCONNECTIONS, OPENINGS, AND PADS HAVING GREATER WIDTH THAN THE OPENINGS

(75) Inventors: Ji-Yong Park, Yongin-si (KR); Hee-Seok Lee, Yongin-si (KR); Chul-Woo Kim, Incheon (KR); Sang-Gui Jo, Seoul (KR); Kwang-Jin Bae, Suwon-si (KR); Seung-Hwan Kim, Incheon (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 134 days.

(21) Appl. No.: 13/028,836

(22) Filed: Feb. 16, 2011

(65) Prior Publication Data

US 2011/0227221 A1   Sep. 22, 2011

(30) Foreign Application Priority Data

Mar. 17, 2010 (KR) .................. 10-2010-0023973

(51) Int. Cl.
*H01L 23/498* (2006.01)
*H01L 21/768* (2006.01)
*H01L 23/12* (2006.01)
*H01L 23/053* (2006.01)

(52) U.S. Cl.
USPC ............ 257/738; 257/E23.021; 257/E21.579; 257/737; 257/778; 257/774; 257/773; 257/784

(58) Field of Classification Search
USPC ............... 257/738, E23.021, E21.579, 737, 257/734, 778, 774, 773, 784
See application file for complete search history.

(56) References Cited

U.S. PATENT DOCUMENTS

| 6,940,179 B2 | 9/2005 | Lee | |
|---|---|---|---|
| 7,663,226 B2* | 2/2010 | Cho et al. | 257/701 |
| 2008/0053688 A1* | 3/2008 | Park et al. | 174/258 |
| 2008/0225501 A1* | 9/2008 | Cho et al. | 361/767 |
| 2011/0247871 A1* | 10/2011 | Park et al. | 174/262 |

FOREIGN PATENT DOCUMENTS

| JP | 2004-055660 | | 2/2004 |
|---|---|---|---|
| JP | 2006-106613 | * | 4/2006 |
| JP | 2006-210866 A | * | 10/2006 |
| JP | 2009-141305 A | * | 6/2009 |
| KR | 10-2007-0010451 | | 1/2007 |

OTHER PUBLICATIONS

Zhang, et al. "Advanced Interconnect Materials for Ink-jet Printing by Low Temperature Sintering", IEEE, 2009 Electronic Components and Technology Conference, pp. 150-154.

* cited by examiner

*Primary Examiner* — A O Williams
(74) *Attorney, Agent, or Firm* — Muir Patent Consulting, PLLC

(57) ABSTRACT

An electronic device includes first and second interconnections formed on a first surface of a substrate and spaced apart from each other. The electronic device includes a first insulating material layer disposed on the substrate including the first and second interconnections and including a first opening exposing a predetermined region of the first interconnection. The electronic device further includes a first pad filling the first opening and having a greater width than the first opening. The first pad covers at least a part of the second interconnection adjacent to one end of the first interconnection, and the first pad is electrically insulated from the second interconnection by the first insulating material layer.

18 Claims, 16 Drawing Sheets

ELECTRONIC DEVICE HAVING INTERCONNECTIONS, OPENINGS, AND PADS HAVING GREATER WIDTH THAN THE OPENINGS

CROSS-REFERENCE TO RELATED APPLICATION

This application claims priority under 35 U.S.C. §119 to Korean Patent Application No. 10-2010-0023973 filed on Mar. 17, 2010, the disclosure of which is hereby incorporated by reference in its entirety.

BACKGROUND

1. Field

Embodiments of the inventive concept relate to an electronic device including interconnections and pads electrically connected to the interconnections.

2. Description of Related Art

Research into a compact-sized electronic devices is actively progressing. In particular, electronic devices, such as circuit boards and semiconductor modules, may include components such as interconnections, pads, and ball structures, for electronically and mechanically connecting components within the devices as well as to other devices. To permit these electronic devices to become smaller, these components may need to be re-structured or changed.

SUMMARY

Embodiments of the inventive concept provide a method of forming interconnections and pads electrically connected to the interconnections, and an electronic device including the interconnections and the pads to improve integration density.

In accordance with one embodiment, an electronic device is disclosed. The electronic device includes first and second interconnections formed on a first surface of a substrate and spaced apart from each other. The electronic device includes a first insulating material layer disposed on the substrate including the first and second interconnections and including a first opening exposing a predetermined region of the first interconnection. The electronic device further includes a first pad filling the first opening and having a greater width than the first opening. The first pad covers at least a part of the second interconnection adjacent to one end of the first interconnection, and the first pad is electrically insulated from the second interconnection by the first insulating material layer.

In accordance with another embodiment, an electronic device includes a substrate, an interconnection formed on the substrate, an insulating material layer covering the substrate having the interconnection and including an opening exposing a predetermined region of the interconnection, a pad filling the opening, and a ball structure on the pad. At least a portion of the pad has a greater width than a width of the predetermined region of the interconnection and is electrically connected to the interconnection. In addition, the pad is formed by coating a liquid-phase material containing metal particles or metal powders to cover the opening, and performing a sintering process for solidifying the coated material at a lower temperature than a melting point of the metal particles or metal powders.

In accordance with yet another embodiment, a method of fabricating an electronic device is disclosed. The method includes providing a substrate, and forming a plurality of interconnections including at least first, second, and third interconnections, on a first surface of the substrate. The second interconnection is located between the first and third interconnections and has a length in a first direction and a width in a second direction perpendicular to the first direction. The method further includes forming an insulating material layer on the first surface of the substrate, the insulating material including openings exposing at least a first portion of the top surface of the second interconnection. The method additionally includes forming a first pad on the substrate over the first portion of the top surface of the second interconnection, the pad being electrically connected to the second interconnection, and forming a first ball on the first pad. The first pad is formed by coating a liquid-phase material containing metal particles or metal powders to cover the opening, and performing a sintering process for solidifying the coated material at a lower temperature than a melting point of the metal particles or metal powders, and the plurality of interconnections are formed using a different process than the process for forming the first pad.

BRIEF DESCRIPTION OF THE DRAWINGS

The foregoing and other features and advantages of the inventive concepts will be apparent from the more particular description of embodiments of the inventive concepts, as illustrated in the accompanying drawings in which like reference characters refer to like parts throughout the different views. The drawings are not necessarily to scale, emphasis instead being placed upon illustrating the principles of the inventive concepts. In the drawings.

DETAILED DESCRIPTION OF THE EMBODIMENTS

Figure 1A:
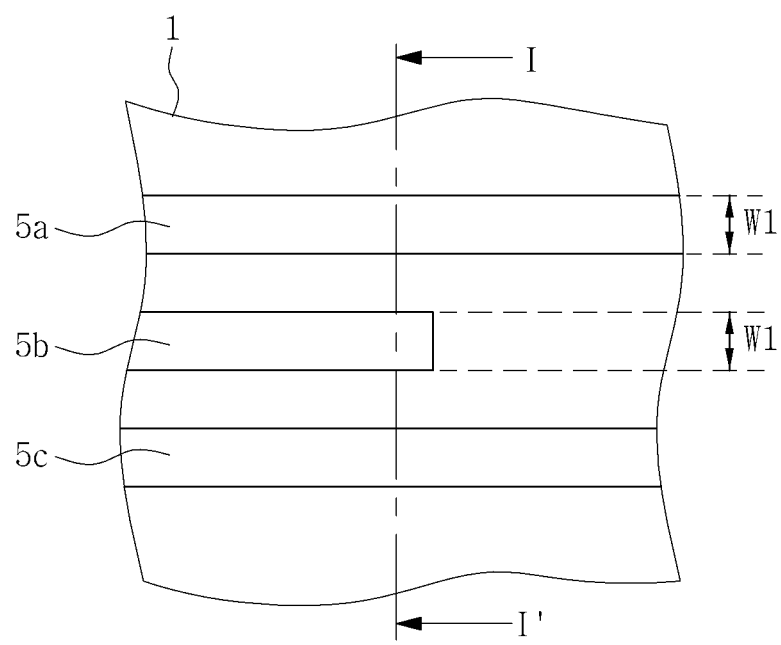
FIGS. 1A to 3D are exemplary diagrams of an electronic device according to one embodiment of the inventive concept.

Various embodiments will now be described more fully with reference to the accompanying drawings in which some embodiments are shown. These inventive concepts may, however, be embodied in different forms and should not be construed as limited to the embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A method of fabricating an electronic device and an electronic device fabricated using the same is described below with reference to FIGS. 1A to 3D. In FIGS. 1A to 3D, FIGS. 1A, 2A and 3A are plan views, FIG. 1B is a cross-sectional view of a region taken along line I-I' of FIG. 1A, FIG. 2B is a cross-sectional view of a region taken along line I-I' of FIG. 2A, and FIGS. 3B, 3C and 3D are cross-sectional views of a region taken along line I-I' of FIG. 3A.

Figure 1B:
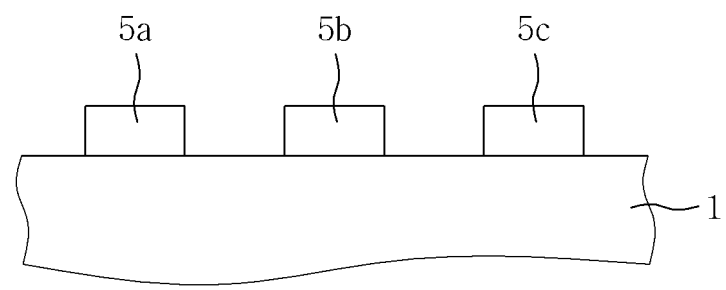

Referring to FIGS. 1A and 1B, in one embodiment, a substrate 1 is prepared. The substrate 1 may be, for example, a printed circuit board or a ceramic substrate. Alternatively, the substrate 1 may be a semiconductor substrate in which integrated circuits are formed.

First to third interconnections 5*a*, 5*b*, and 5*c* may be formed on the substrate 1. The first to third interconnections 5*a*, 5*b*, and 5*c* may be spaced apart from each other and be sequentially disposed. For example, the first interconnection 5*a* and the third interconnection 5*c* may be arranged parallel to each other with the second interconnection 5*b* interposed therebetween. As such, the first interconnection 5*a* may be adjacent to the second interconnection 5*b*, and the second interconnection 5*b* may be adjacent to the third interconnection 5*c*.

In some embodiments, the first to third interconnections 5a, 5b, and 5c are formed of a metal material by plating. The plating may include electroless plating or electroplating. For example, forming the first to third interconnections 5a, 5b, and 5c may include forming a seed layer on the substrate 1, forming a metal material layer on the seed layer by plating, and patterning the metal material layer. The first to third interconnections 5a, 5b, and 5c may be formed of a conductive material such as copper (Cu), silver (Ag), gold (Au), etc.

In other embodiments, the first to third interconnections 5a, 5b, and 5c may be formed of a metal material using a deposition method such as chemical vapor deposition (CVD) or physical vapor deposition (PVD). For example, the first to third interconnections 5a, 5b, and 5c may be formed by forming a conductive material layer such as Cu or aluminum (Al) using a deposition method such as CVD or PVD, and patterning the conductive material layer.

In still other embodiments, the first to third interconnections 5a, 5b, and 5c may be formed by bonding a film on which the interconnections are formed to the substrate 1. In this case, the film may be removed.

The interconnections may be formed in the form of a conductive line, extending along a plane parallel to the surface of the substrate, and having a height and width substantially smaller than the length. The interconnections may have, for example, squared or rounded edges, depending on the method used to form them.

In one embodiment, one end of the second interconnection 5b is formed to have the same width (W1) as the portion of the first and third interconnections 5a and 5c adjacent to the end. As such, a middle portion and one end of the second interconnection 5b may be formed to have substantially the same width.

Figure 2A:
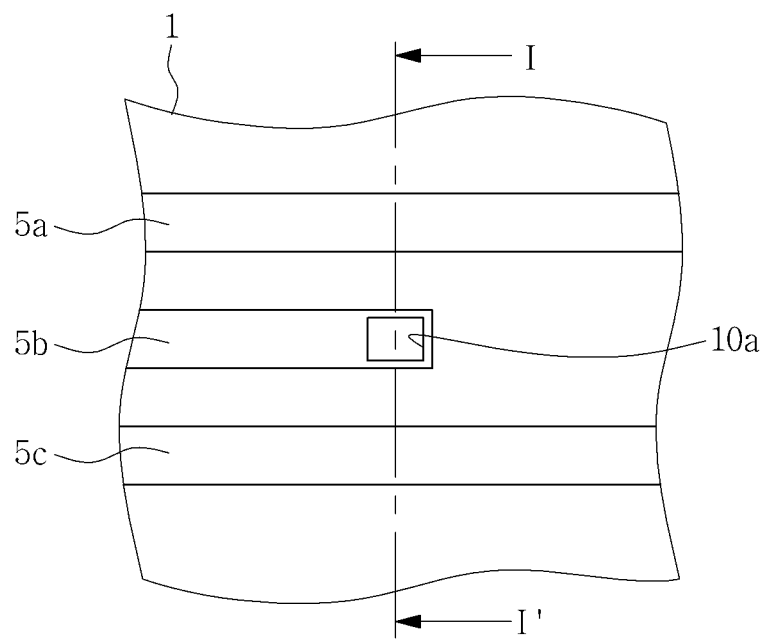
Figure 2B:
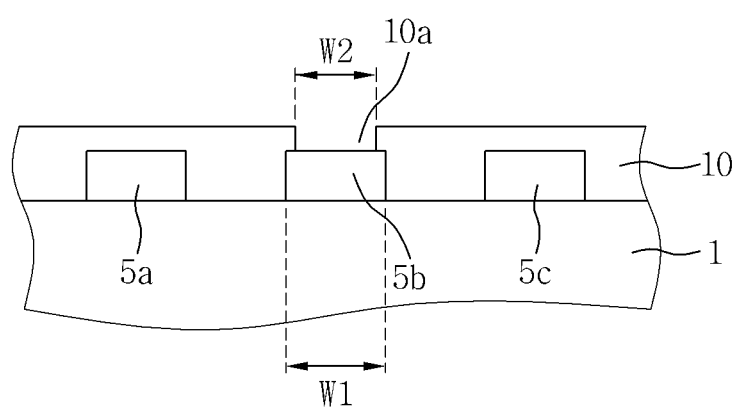

Referring to FIGS. 2A and 2B, in one embodiment, an insulating material layer 10 is formed on the substrate having the first to third interconnections 5a, 5b, and 5c. The insulating material layer 10 may be a resist layer. The resist layer may be a photosensitive solder resist (PSR) material.

The insulating material layer 10 may be exposed and developed to form an opening 10a exposing a top surface of one end of the second interconnection 5b. In one embodiment, the opening 10a has a smaller width (W2) than the width (W1) of the end of the second interconnection 5b.

While it is not illustrated, openings exposing ends of the first and third interconnections 5a and 5c may be formed while forming the opening 10a.

The end of the second interconnection 5b may be formed to have the same width as the second interconnection 5b. That is, the end of the second interconnection 5b may be formed to have the same width as the middle portion of the second interconnection 5b.

Figure 3A:
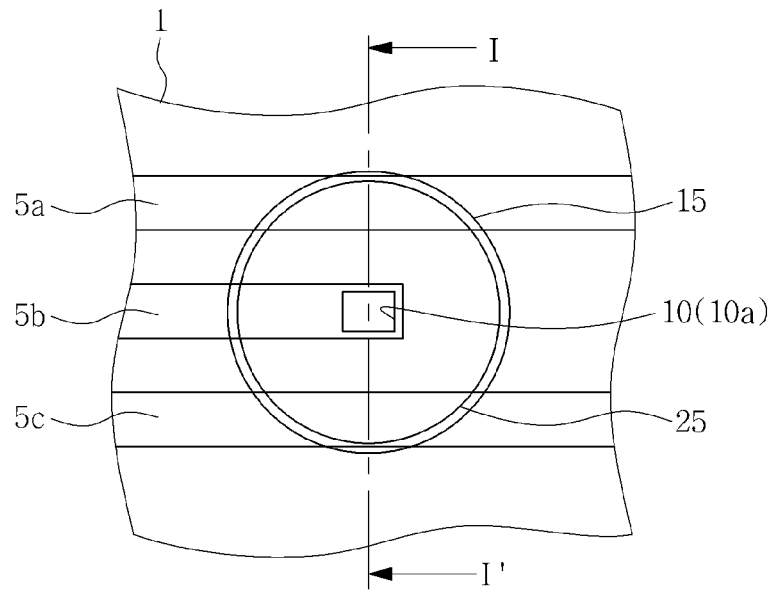
Figure 3B:
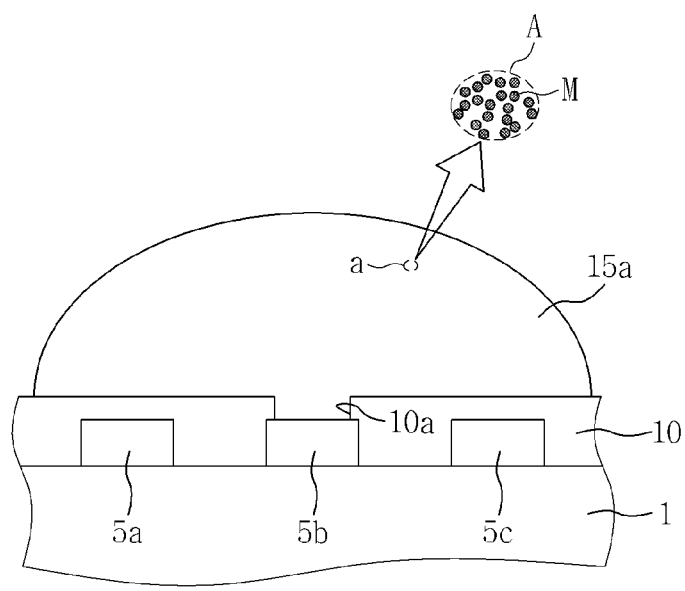

Referring to FIGS. 3A and 3B, an ink containing metal particles or metal powders may be coated on the opening 10a to form a preliminary pad 15a. Coating the ink may be performed using a printing process. The preliminary pad 15a may be a liquid containing metal particles or metal powders. The preliminary pad 15a may completely fill the opening 10a and may have a greater width than the opening 10a to cover the opening 10a.

A portion indicated as "A" in FIG. 3B represents an enlarged portion of a predetermined region a of the preliminary pad 15a. Referring to the portion indicated as "A" in FIG. 3B, the preliminary pad 15a may contain metal particles or metal powders M inside. The metal particles or metal powders M may be Cu, Ag, Au, etc. For example, the preliminary pad 15a may be formed of a nano metal ink in which metal particles or metal powders M including at least one of Cu, Ag and Au are dispersed in a solvent. In the portion indicated as "A" in FIG. 3B, a space between the metal particles or metal powders M may be filled with a solvent. The metal particles or metal powders M may be formed to a size, for example, of about 1 nm to about 100 nm.

In some embodiments, before forming the preliminary pad 15a, a pre-process may be performed on the substrate having the opening 10a using a plasma method and/or a chemical method to stably form the preliminary pad 15a. As a result of the pre-process, contaminants on a surface of the interconnection 5b exposed by the opening 10a may be removed, or surface roughness of a material constituting the surface of the substrate may be adjusted.

When a surface of the insulating material layer 10 in direct contact with the preliminary pad 15a is considerably smooth, the liquid-phase preliminary pad 15a may spread out, unable to maintain a regular shape. Therefore, in order to prevent such a drawback, a pre-process may be performed such that the preliminary pad 15a has a minimum roughness to maintain a semicircular shape.

The formation of the preliminary pad 15a may be performed using an inkjet printing technique in which an ink containing metal particles or metal powders is sprayed on the opening 10a. For example, forming the preliminary pad 15a may include mechanically and/or electrically controlling the flow of a metal ink containing metal particles or metal powders, such that the ink is selectively sprayed or coated on the opening 10a. In one embodiment, the metal particles or metal powders in the metal ink may be formed to a size of about 1 nm to about 100 nm.

Forming the preliminary pad 15a is not limited to the inkjet printing technique. For example, the liquid-phase preliminary pad 15a may be formed using screen printing technology, gravure printing technology, flexography printing technology, offset printing technology, etc.

The shape and size of the preliminary pad 15a may be determined depending on the amount and viscosity of a solvent constituting the preliminary pad 15a in addition to the metal particles or metal powders M.

Figure 3C:
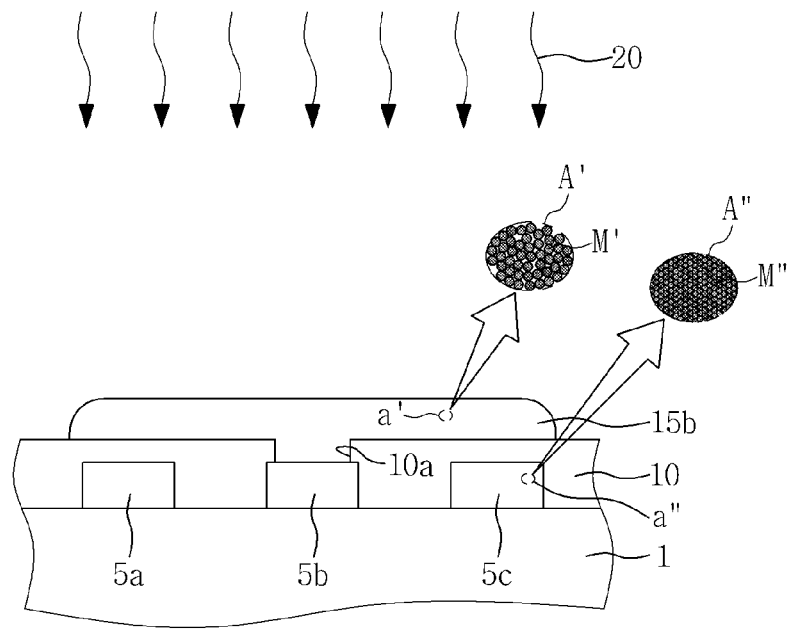

Referring to FIGS. 3A and 3C, a sintering process 20 for changing the preliminary pad 15a from the liquid phase to a solid phase may be performed, so that a pad 15b may be formed.

The sintering process 20 may include, for example, performing an annealing process and/or a UV process. The sintering process 20 may be an annealing process performed at a temperature equal to or lower than a melting point of the metal particles or metal powders M in the preliminary pad 15a. For example, the sintering process 20 may be a process of sintering the preliminary pad 15a at a temperature of about 100° C. to about 300° C. As a result, the metal particles or metal powders M in the preliminary pad 15a may be in contact with or coupled to each other without being molten.

In FIG. 3C, a portion indicated as "A'" represents an enlarged portion of a predetermined region a' of the pad 15b, and a portion indicated as "A'"" represents an enlarged portion of a predetermined region a" of the interconnection 5c. Here, the portions respectively indicated as "A'" and "A''" may correspond to the pad 15b and the interconnection 5c enlarged at the same ratio. Referring to the portion indicated as "A'" of FIG. 3C, it is observed that the metal particles or metal powders M in the pad 15b are connected to each other. Therefore, the pad 15b may be formed of a conductive material containing at least one of Cu, Ag and Au. Since the sintering process 20 is performed at a temperature equal to or lower than the melting point of the metal particles or metal powders M, the metal particles or metal powders M may be coupled without being molten. Therefore, in one embodiment, surface roughness of the pad 15b depends on the size of the metal particles or metal powders M. When the metal particles or metal powders M are in the shape of spheres having a diameter of about 20 nm or in the shape of bars having a length of about 20 nm, since the metal particles or metal powders M are coupled without being molten, the surface or cross-sectional roughness of the pad 15b may be greater than those of the first to third interconnections 5a, 5b, and 5c formed by plating or depositing. Also, the size of the metal particles or metal powders M constituting the pad 15b may be greater than particles M" of a material constituting the interconnection 5c.

Since the metal particles or metal powders M are coupled to each other without being molten, a space may be formed between the metal particles or metal powders M in the pad 15b. When the first to third interconnections 5a, 5b, and 5c are formed by plating, a cross-section of one of the first to third interconnections 5a, 5b, and 5c, which is enlarged at the same ratio as the portion indicated as "A'" in FIG. 3C, i.e., a portion indicated as "A",," may not contain any of the space such as formed in the pad 15b. As such, a density of the pad 15b may be lower than a density of the first to third interconnections 5a, 5b, and 5c.

A top surface of the pad 15b may be made flat. A boundary region between the top surface and sidewall of the pad 15b may be in a round shape.

In one embodiment, the pad 15b is formed to cover the second interconnection 5b, and also at least a part of the first interconnection 5a adjacent to one end of the second interconnection 5b. As such, the pad may be described as having two portions—a first portion is within the opening in the insulating material layer 10, and a second portion is outside of the opening, for example, above the opening and also covering an area wider from a top-down perspective than the opening. Further, the pad 15b may cover at least a part of the third interconnection 5c adjacent to the one end of the second interconnection 5b. For example, the pad 15b may cover the one end of the second interconnection 5b exposed by the opening 10a, and may extend to cross over the first interconnection 5a and/or the third interconnection 5c adjacent to the end of the second interconnection 5b exposed by the opening 10a, to cover the first interconnection 5a and/or the third interconnection 5c. The pad 15b, the first interconnection 5a and the third interconnection 5c may be spaced apart and insulated from each other by the insulating material layer 10.

Figure 3D:
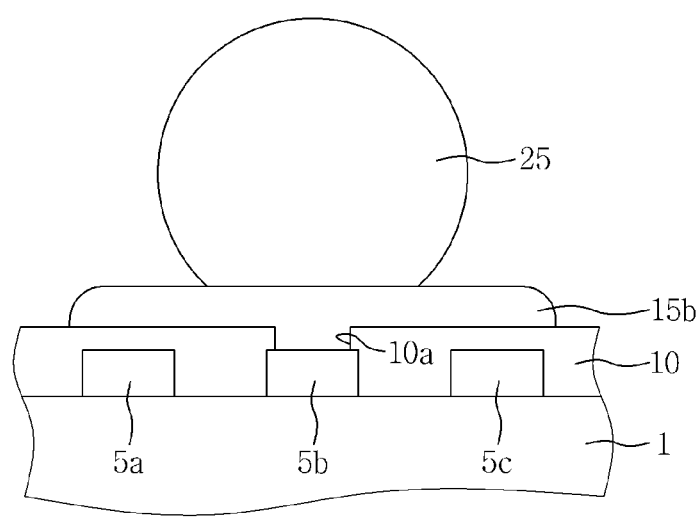

Referring to FIGS. 3A and 3D, in one embodiment, a ball structure 25 is formed on the pad 15b. As such, the pad 15b functions as a ball land. The ball structure 25 may be formed by a soldering process. The ball structure 25 may be a component for electrically connecting a printed circuit board (PCB) to a chip or package. Alternatively, the ball structure 25 may be a component for electrically connecting a first package to a second package or electrically connecting a package to a module board or main circuit board.

Therefore, an electronic device including the first to third interconnections 5a, 5b, and 5c formed on the substrate 1, the insulating material layer 10 having the opening 10a, the pad 15b and the ball structure 25 may be provided. The pad 15b may be disposed at a higher level than the first to third interconnections 5a, 5b, and 5c. Further, the pad 15b may be electrically connected to an end of the second interconnection 5b through the opening 10a having a narrower width than the pad 15b. Therefore, the pad 15b having a great planar area may be provided, and the highly integrated or arranged interconnections 5a, 5b, and 5c may be provided.

As illustrated in FIG. 3C, the top surface of the pad 15b may be flat. However, the inventive concept is not limited thereto, and may be modified, for example, as illustrated in FIGS. 4A and 4B.

Figure 4A:
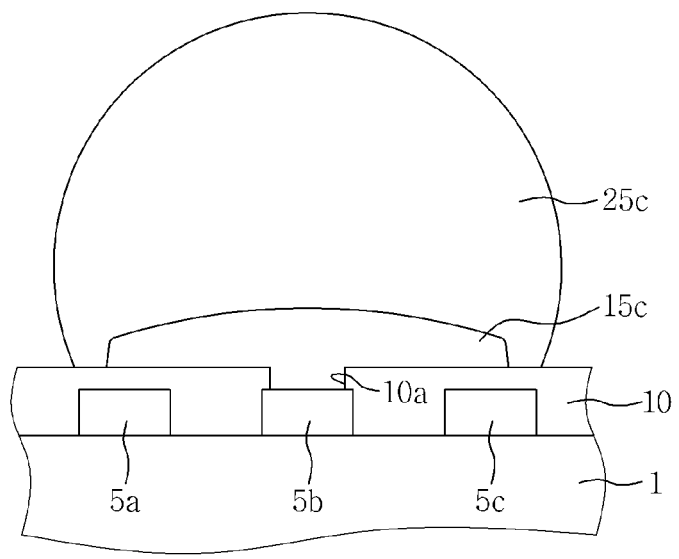
FIG. 4A is an exemplary cross-sectional view of an electronic device according to another embodiment of the inventive concept.

Referring to FIG. 4A, a pad 15c having a swollen central portion may be provided. As a result of forming the pad 15c having the swollen central portion, a contact area between a ball structure 25c formed on the pad 15c and the pad 15c may be increased, so that the ball structure 25c may be stably bonded to the pad 15c. Meanwhile, the ball structure 25c may be formed to cover a sidewall of the pad 15c in addition to the top surface of the pad 15c, further increasing the contact area.

Figure 4B:
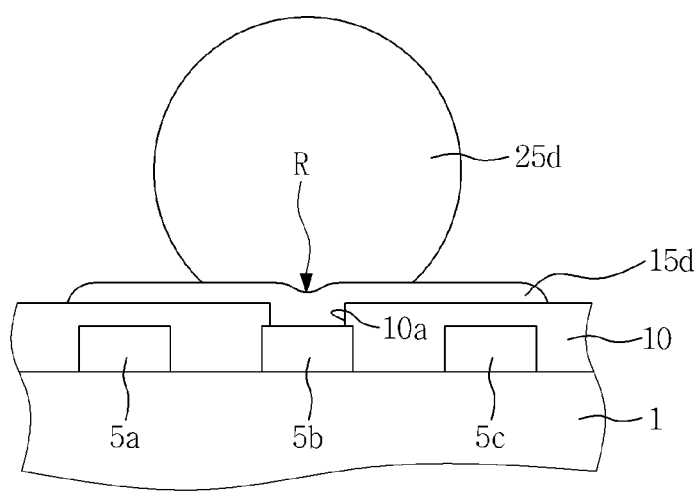
FIG. 4B is an exemplary cross-sectional view of an electronic device according to still another embodiment of the inventive concept.

Referring to FIG. 4B, a pad 15d having a partially recessed top surface may be provided. The pad 15d may have a recessed portion R on the top surface corresponding to the opening 10a. The recessed portion R of the pad 15d may allow a ball structure 25d to be stably formed on the pad 15d.

The inventive concept is not limited to these embodiments, and may be embodied in many different forms. Differences from the above embodiments will be described below.

Figure 5A:
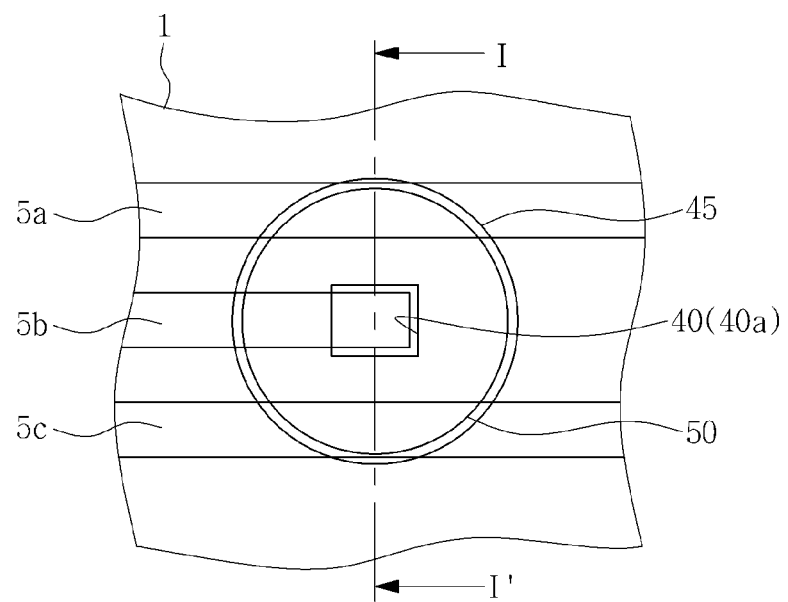
FIGS. 5A and 5B are exemplary diagrams of an electronic device according to yet another embodiment of the inventive concept.
Figure 5B:
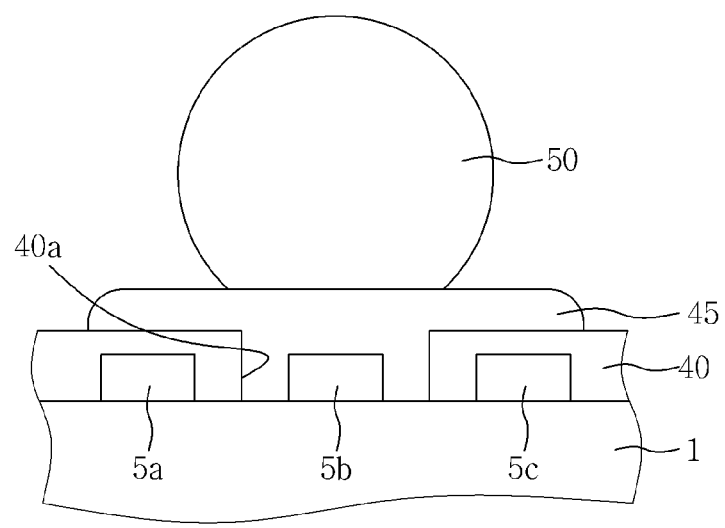

An electronic device according to another embodiment will be described with reference to FIGS. 5A and 5B. In FIGS. 5A and 5B, FIG. 5A is a plan view, and FIG. 5B is a cross-sectional view taken along line I-I' of FIG. 5A.

Referring to FIGS. 5A and 5B, first to third interconnections 5a, 5b, and 5c may be formed on a substrate 1 as described above with reference to FIGS. 1A and 1B.

In one embodiment, an insulating material layer 40 having an opening 40a exposing a top surface and at least one sidewall of one end of the second interconnection 5b is formed on the substrate having the first to third interconnections 5a, 5b, and 5c. The insulating material layer 40 may be a resist layer (e.g., the resist layer may be a PSR layer).

While the opening 10a in FIG. 3A exposes the top surface of one end of the second interconnection 5b, the opening 40a of FIGS. 5A and 5B exposes the top surface and sidewalls of one end of the second interconnection 5b. Therefore, a surface area of one end of the second interconnection 5b exposed by the opening 40a may be increased.

Afterwards, as described with reference to FIGS. 3A to 3C, a pad 45 filling the opening 40a and having a greater width than the opening 40a may be formed. Then, as described with reference to FIG. 3D, a ball structure 50 may be formed on the pad 45.

According to the embodiment, since the area on the top surface of one end of the second interconnection 5b exposed by the opening 40a is increased and the contact area between the pad 45 and the second interconnection 5b is increased, electrical and mechanical connection of the pad 45 to the second interconnection 5b may be more stably made.

Figure 6:
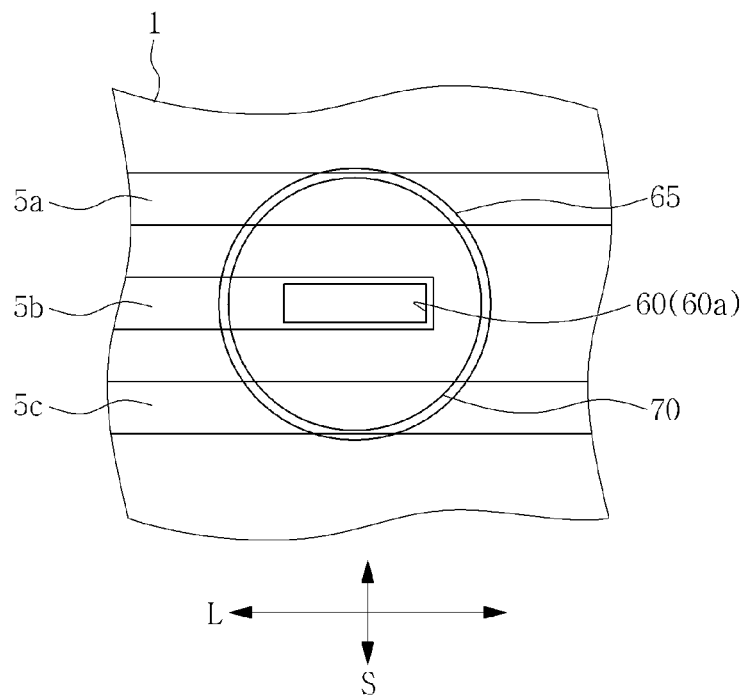
FIG. 6 is an exemplary plan view of an electronic device according to yet another embodiment of the inventive concept.

An electronic device according to still another embodiment will be described with reference to FIG. 6. Referring to FIG. 6, the opening 10a may be modified to an opening 60a of a rectangular or oval shape having a major axis L and a minor axis S. That is, an insulating material layer 60 including the opening 60a that has the major axis L and the minor axis S may be formed on the substrate 1. The major axis L of the opening 60a may be in a longitudinal direction of the second interconnection 5b, and the minor axis S may be in a transverse direction along the width of the second interconnection 5b.

A pad 65 filling the opening 60a and having a greater width than the opening 60a may be formed on the insulating material layer 60 as described above with reference to FIGS. 3A to 3C. Afterwards, a ball structure 70 may be formed on the pad 65 as described with reference to FIG. 3D.

Since the opening 60a is formed in an elongated shape having the major axis L and the minor axis S, an area of the one end of the second interconnection 5b exposed by the opening 60a may be increased. Therefore, the electrical and mechanical connection of the pad 65 to the second interconnection 5b may be more stably made.

Figure 7:
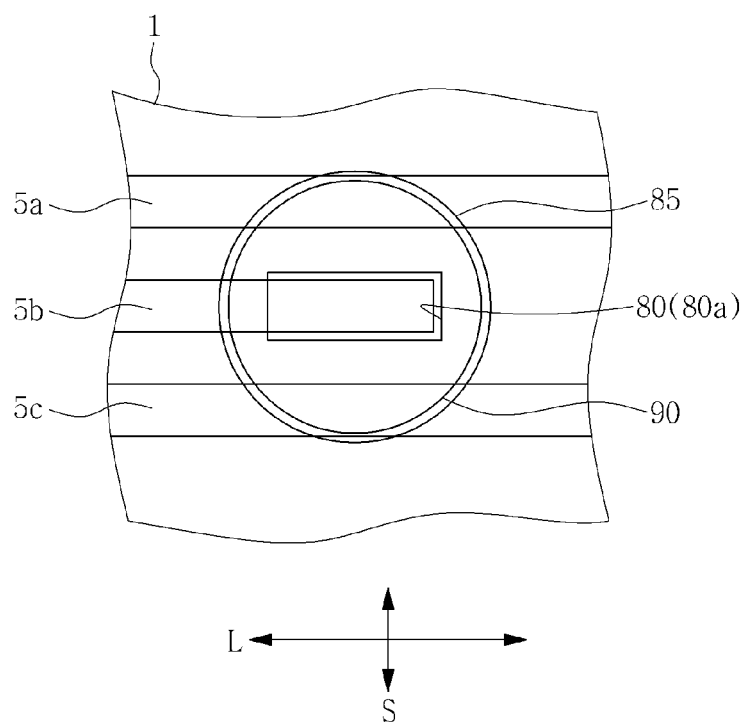
FIG. 7 is an exemplary plan view of an electronic device according to yet another embodiment of the inventive concept.

An electronic device according to yet another embodiment will be described with reference to FIG. 7. Referring to FIG. 7, the opening 60a of FIG. 6 may be modified to an opening 80a exposing one or more sidewalls of the second interconnection 5b in addition to the top surface of the one end of the second interconnection 5b. That is, an insulating material layer 80 having the opening 80a exposing the top surface and sidewalls of the one end of the second interconnection 5b may be formed on the substrate 1 having the first to third interconnections 5a, 5b, and 5c.

A pad 85 filling the opening 80a and having a greater width than the opening 80a may be formed on the insulating material layer 80 as described with reference to FIGS. 3A to 3C. Then, a ball structure 90 may be formed on the pad 85 as described with reference to FIG. 3D. Therefore, since the top surface and sidewall of the one end of the second interconnection 5b are exposed by the opening 80a having a major axis L and a minor axis S, electrical and mechanical connection of the pad 85 to the second interconnection 5b may be more stably made.

Figure 8:
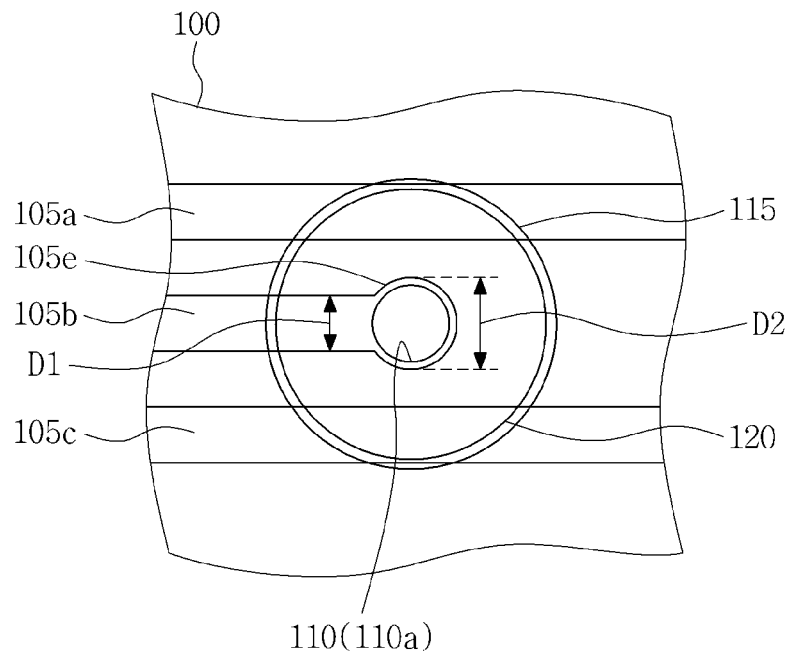
FIG. 8 is an exemplary plan view of an electronic device according to yet another embodiment of the inventive concept.

An electronic device according to yet another embodiment will be described with reference to FIG. 8. Referring to FIG. 8, as described with reference to FIG. 1, first to third interconnections 105a, 105b, and 105c may be formed on a substrate 100. The first interconnection 105a and the third interconnection 105c may be arranged parallel to each other with the second interconnection 105b interposed therebetween.

One end 105e of the second interconnection 105b may be formed to have a greater width D2 than the width D1 of remaining portions of second interconnection 105b. The one end of the second interconnection 105b may be formed in the shape of a sphere or hemisphere.

An insulating material layer 110 having an opening 110a exposing a top surface of the one end 105e of the second interconnection 105b may be formed. Then, as described with reference to FIGS. 3A to 3C, a pad 115 filling the opening 110a and having a greater width than the opening 110a may be formed. Afterwards, a ball structure 120 may be formed on the pad 115 as described with reference to FIG. 3D.

The one end 105e of the second interconnection 105b having a greater width than an interconnection portion of the second interconnection 105b may cause an area of the second interconnection 105b exposed by the opening 110a to be increased. Therefore, electrical and mechanical connection of the pad 115 to the second interconnection 105b may be more stably made.

Figure 9:
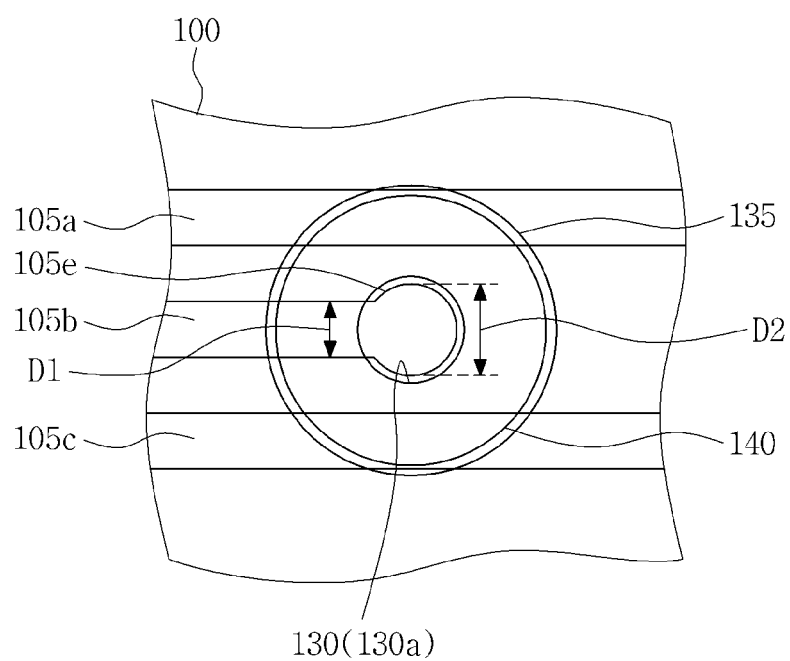
FIG. 9 is an exemplary plan view of an electronic device according to yet another embodiment of the inventive concept.

An electronic device according to yet another embodiment will be described below with reference to FIG. 9. Referring to FIG. 9, the opening 110a of FIG. 8 may be modified to an opening 130a exposing a sidewall of the second interconnection 105b in addition to the top surface of the one end 105e of the second interconnection 105b. That is, an insulating material layer 130 having an opening 130a exposing the top surface and sidewall of the one end 105e of the second interconnection 105b may be formed on the substrate 100 having the first to third interconnections 105a, 105b, and 105c. A pad 135 filling the opening 130a and having a greater width than the opening 130a may be formed as described with reference to FIGS. 3A to 3D. Then, as described with reference to FIG. 3D, a ball structure 140 may be formed on the pad 135.

Figure 10:
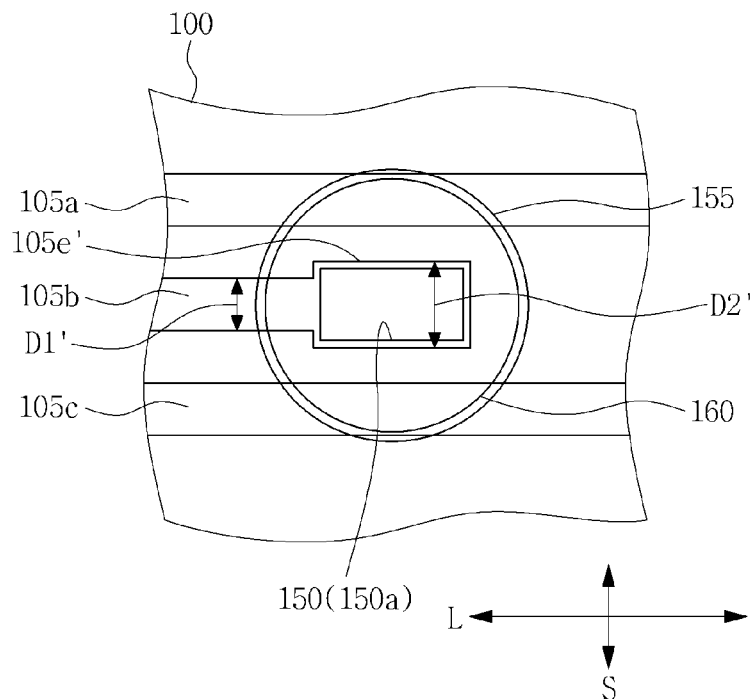
FIG. 10 is an exemplary plan view of an electronic device according to yet another embodiment of the inventive concept.

An electronic device according to yet another embodiment will be described with reference to FIG. 10. Referring to FIG. 10, the one end 105e of the second interconnection 105b in FIG. 9 may be modified to one end 105e' in a rectangular or oval shape having a major axis L and a minor axis S.

Therefore, the one end 105e' of the second interconnection 105b may be formed to have a greater width D2' than the width D1' of the interconnection portion of the second interconnection 105b, and may be formed in a rectangular or oval shape having a major axis L and a minor axis S. Accordingly, an opening 150a exposing the end 105e' of the second interconnection 105b may be formed in a rectangular or oval shape having a major axis L and a minor axis S.

A pad 155 filling the opening 150a and having a greater width than the opening 150a may be formed on the insulating material layer 150 having the opening 150a as described with reference to FIGS. 3A to 3C. Afterwards, a ball structure 160 may be formed on the pad 155 as described with reference to FIG. 3D.

Therefore, since an area of the one end 105e' of the second interconnection 105b exposed by the opening 40a may be increased, electrical and mechanical connection of the pad 155 to the second interconnection 105b may be more stably made.

Figure 11:
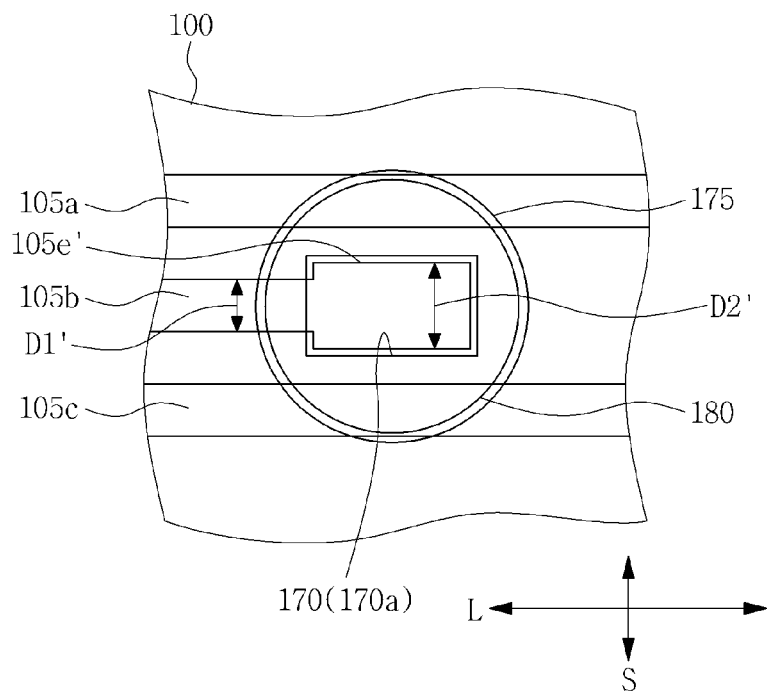
FIG. 11 is an exemplary plan view of an electronic device according to yet another embodiment of the inventive concept.

An electronic device according to yet another embodiment will be described below with reference to FIG. 11. Referring to FIG. 11, the opening 170a of FIG. 10 may be modified to an opening 170a exposing a sidewall of the second interconnection 105b in addition to the top surface of the one end 105e' of the second interconnection 105b. That is, an insulating material layer 170 having the opening 170a exposing the top surface and sidewall of the one end 105e' of the second interconnection 105b may be formed on the substrate 100 having the first to third interconnections 105a, 105b, and 105c. Therefore, an area of the one end 105e' of the second interconnection 105b exposed by the opening 170a may be further increased.

Then, a pad 175 filling the opening 170a and having a greater width than the opening 170a may be formed on the insulating material layer 170 as described with reference to FIGS. 3A to 3C. Afterwards, a ball structure 180 may be formed on the pad 175 as described with reference to FIG. 3D.

Figure 12:
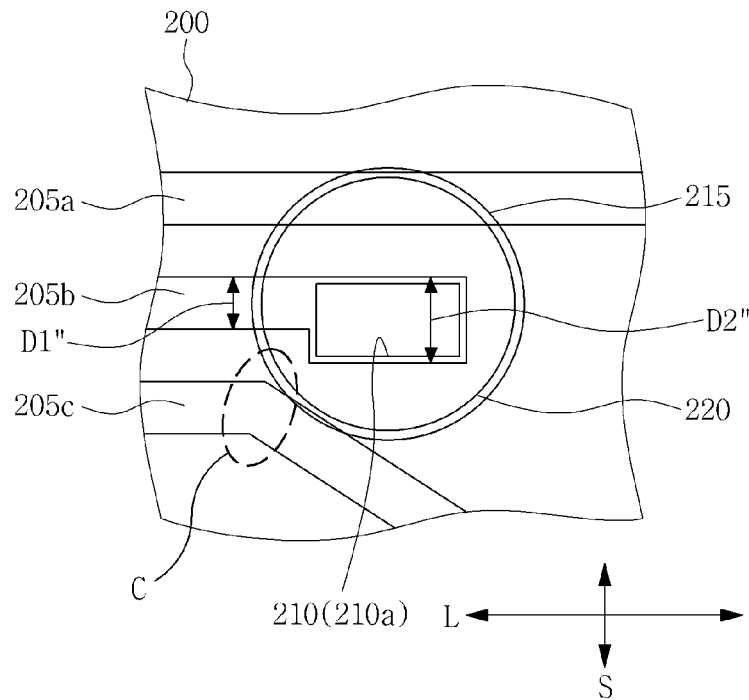
FIG. 12 is an exemplary plan view of an electronic device according to yet another embodiment of the inventive concept.

An electronic device according to yet another embodiment will be described with reference to FIG. 12. Referring to FIG. 12, first to third interconnections 205a, 205b, and 205c may be formed on a substrate 200. The first interconnection 205a and the third interconnection 205c may be arranged parallel to each other with the second interconnection 205b interposed therebetween.

The third interconnection 205c may be arranged partly parallel to the first interconnection 205a, and partly bent to be distant from the first interconnection 205a. The first to third interconnections 205a, 205b and 205c may be in parallel up to a portion C where the third interconnection 205c is bent.

One end of the second interconnection 205b may be formed to have a greater width D2" than a width D1" of remaining portions of the second interconnection 205b. Further, the width of the one end of the second interconnection 205b may be increased toward the third interconnection 205c. Therefore, space efficiency between the first interconnection 205a and the third interconnection 205c may be enhanced.

An insulating material layer 210 having an opening 210a exposing a top surface of the one end of the second interconnection 205b may be formed. Then, as described with reference to FIGS. 3A to 3C, a pad 215 filling the opening 210a and having a greater width than the opening 210a may be formed on the insulating material layer 210 having the opening 210*a*. Subsequently, as described with reference to FIG. 3D, a ball structure 220 may be formed on the pad 215.

Figure 13:
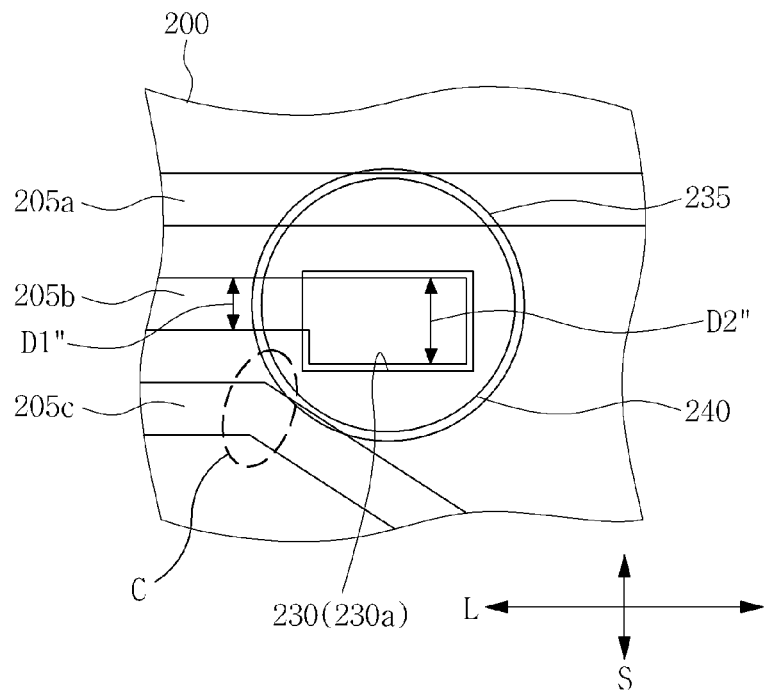
FIG. 13 is an exemplary plan view of an electronic device according to yet another embodiment of the inventive concept.

An electronic device according to yet another embodiment will be described with reference to FIG. 13. Referring to FIG. 13, the opening 210*a* of FIG. 12 may be modified to an opening 230*a* exposing a sidewall of the second interconnection 205*b* in addition to the top surface of the one end of the second interconnection 205*b*. In other words, an insulating material layer 230 having the opening 230*a* exposing the top surface and sidewall of the one end of the second interconnection 205*b* may be formed on the substrate 200 having the first to third interconnections 205*a*, 205*b*, and 205*c*. As a result, an area of the one end of the second interconnection 205*b* exposed by the opening 230*a* may be further increased.

Afterwards, as described with reference to FIGS. 3A to 3C, a pad 235 filling the opening 230*a* and having a greater width than the opening 230*a* may be formed on the insulating material layer 230. Then, a ball structure 240 may be formed on the pad 235 as described with reference to FIG. 3D.

Figure 14:
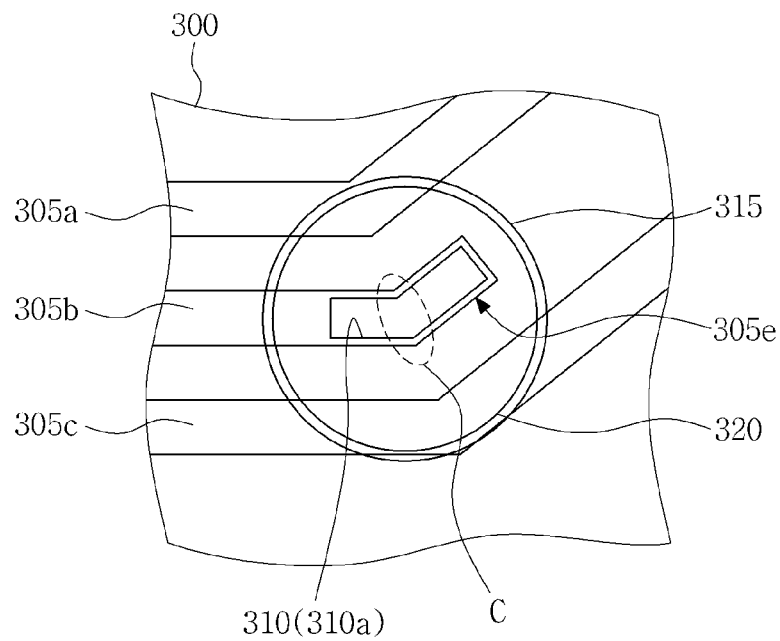
FIG. 14 is an exemplary plan view of an electronic device according to yet another embodiment of the inventive concept.

An electronic device according to yet another embodiment will be described with reference to FIG. 14. Referring to FIG. 14, first to third interconnections 305*a*, 305*b*, and 305*c* may be formed on a substrate 300. The first interconnection 305*a* and the third interconnection 305*c* may be arranged parallel to each other with the second interconnection 305*b* interposed therebetween.

One end 305*e* of the second interconnection 305*b* may include a bent portion C. Further, at least one of the first and third interconnections 305*a* and 305*c* may be bent like the one end 305*e* of the second interconnection 305*b*, such that the orientation of the two interconnections remains parallel before and after the bent portion. For example, the first and third interconnections 305*a* and 305*c* may be bent in the same direction, and the one end 305*e* of the second interconnection 305*b* disposed between the bent portions of the first and third interconnections 305*a* and 305*c* may be bent in the same direction as the first and third interconnections 305*a* and 305*c*.

The one end 305*e* of the second interconnection 305*b* may have the same width as an intermediate interconnection region of the second interconnection 305*b*.

An insulating material layer 310 having an opening 310*a* exposing a top surface of the one end 305*e* of the second interconnection 305*b* may be formed. The opening 310*a* may be in a bent form like the one end 305*e* of the second interconnection 305*b*.

Subsequently, a pad 315 filling the opening 310*a* and having a greater width than the opening 310*a* may be formed on the insulating material layer 310 as described with reference to FIGS. 3A to 3C. Then, a ball structure 320 may be formed on the pad 315 as described with reference to FIG. 3D. Therefore, the pad 315 with a large planar area may be formed without broadening a distance between the interconnections 305*a*, 305*b*, and 305*c*.

Figure 15:
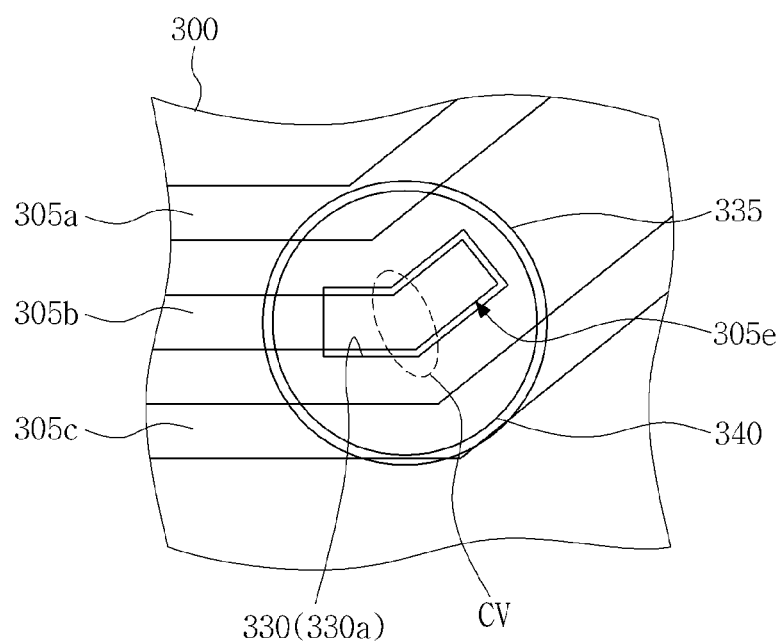
FIG. 15 is an exemplary plan view of an electronic device according to yet another embodiment of the inventive concept.

An electronic device according to yet another embodiment will be described with reference to FIG. 15. Referring to FIG. 15, the opening 310*a* of FIG. 14 may be modified to an opening 330*a* exposing a sidewall of the second interconnection 305*b* in addition to the top surface of the one end 305*e*' of the second interconnection 305*b*. The opening 330*a* and the one end 305*e* of the second interconnection 305*b* may include a bent portion CV. That is, an insulating material layer 330 having the opening 330*a* exposing the top surface and sidewall of the one end of the second interconnection 305*b* may be formed on the substrate 300 having the first to third interconnections 305*a*, 305*b*, and 305*c*. Therefore, an area of the one end 305*e* of the second interconnection 305*b* exposed by the opening 330*a* may be further increased.

Afterwards, a pad 355 filling the opening 330*a* and having a greater width than the opening 330*a* may be formed on the insulating material layer 330 as described with reference to FIGS. 3A to 3C. Then, a ball structure 340 may be formed on the pad 335 as described with reference to FIG. 3D.

As a result of the combination of the embodiments, an electronic device having openings in various shapes and interconnection ends in various forms may be provided on a substrate. For example, the embodiment related to the pad 335 described with reference to FIG. 15 and the embodiment related to the pad 135 described with reference to FIG. 9 may be implemented on a substrate.

An electronic device according to such an embodiment will be described with reference to FIG. 16.

Figure 16:
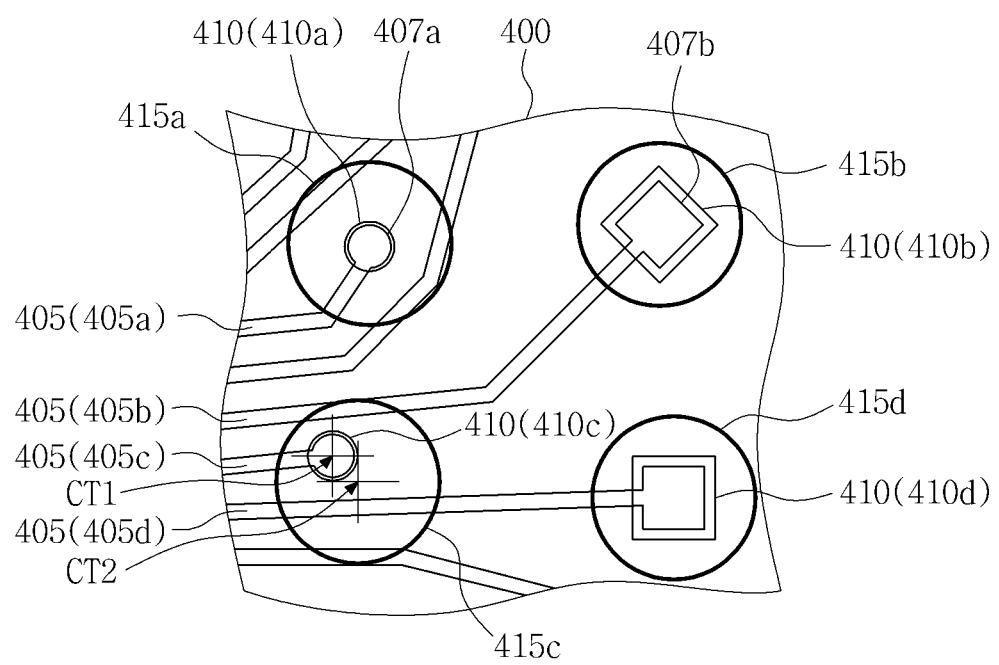
FIG. 16 is an exemplary plan view of an electronic device according to yet another embodiment of the inventive concept.

Referring to FIG. 16, a plurality of interconnections 405 may be formed on a substrate 400. First ends of the interconnections 405 may be formed in various shapes and sizes, depending on a distance between adjacent interconnections. Examining the first interconnection 405*a* having an end 407*a* disposed at a region where a distance between the interconnections is narrow and the second interconnection 405*b* having an end 407*b* at a region where a distance between the interconnections is wide, the end 407*a* of the first interconnection 405*a* has a narrower width than the end 407*b* of the second interconnection 405*b*. Therefore, the end 407*a* of the first interconnection 405*a* may be formed in a different shape or size from the end 407*b* of the second interconnection 405*b*.

An insulating material layer 410 having openings 410*a*, 410*b*, 410*c* and 410*d* exposing first ends of the interconnections 405 may be formed on the substrate having the interconnections 405.

Subsequently, as described with reference to FIGS. 3A to 3C, pads 415*a*, 415*b*, 415*c*, and 415*d* filling the openings 410*a*, 410*b*, 410*c*, and 410*d* and having greater widths than the openings 410*a*, 410*b*, 410*c*, and 410*d* may be formed on the insulating material layer 410. Afterwards, ball structures may be formed on the pads 415*a*, 415*b*, 415*c*, 415*d* as described with reference to FIG. 3D. Though openings 410*a*, 410*b*, 410*c*, and 410*d* are shown as having greater widths than interconnection ends 407*a*, 407*b*, 407*c*, and 407*d*, some of the openings may have a smaller width, or the same width, as their corresponding interconnection ends.

In some embodiments, a center point CT1 of an opening (e.g., the third opening 410*c* exposing one end of the third interconnection 405*c*) may not coincide with a center point of a corresponding pad (e.g., center CT2 of the third pad 415*c* formed on the third opening 410*c*). That is, while the third opening 410*c* is formed at a position out of the center of the third pad 415*c*, it may be covered with the third pad 415*c*. Center points of other pads may align with center points of their corresponding openings (e.g., a center point of the fourth opening 410*d* exposing one end of the fourth interconnection 405*d* may coincide with a center point of the fourth pad 415*d* formed on the opening 410*d*). In this manner, pads and ball structures can be aligned in predictable arrangements, such as a grid pattern, even though the ends of interconnections may not align in the same manner.

In one embodiment, the third pad 415*c* electrically connected to one end of the third interconnection 405*c* may partially cover the second interconnection 405*b* and the fourth interconnection 405*d* of the adjacent second and fourth interconnections 405*b* and 405*d*. Here, the third pad 415*c* may extend to cross over the fourth interconnection 405*d* adjacent to the one end of the third interconnection 405*c*, so that it may cover the fourth interconnection 405*d*.

Taking into account a distance between the interconnections, each of the openings 410a, 410b, 410c and 410d may be formed as one of the openings according to the above-described embodiments. Therefore, openings 410a, 410b, 410c and 410d may be formed in various shapes or sizes on the substrate 400, and more interconnections 405 may be formed on the substrate 400. For example, the first and second openings 410a and 410b may be formed in different shapes or sizes from each other.

Next, an electronic device according to yet another embodiment will be described with reference to FIG. 17.

Figure 17:
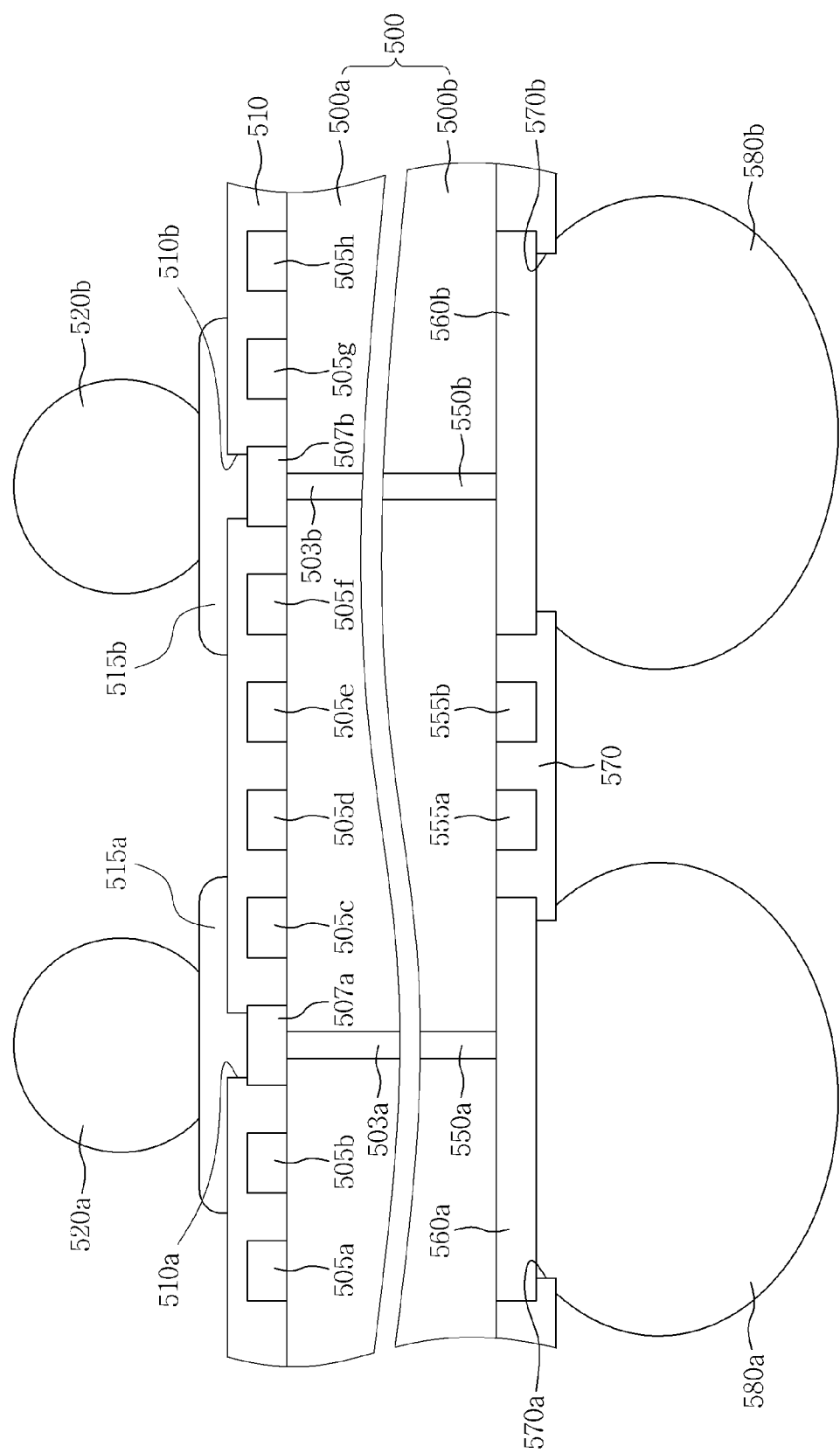
FIG. 17 is an exemplary cross-sectional view of an electronic device according to yet another embodiment of the inventive concept.

Referring to FIG. 17, a plurality of interconnections 505a, 505b, 505c, 505d, 505e, 505f, 505g, 505h, 507a, and 507b may be provided on a first surface of a substrate 500. The substrate 500 may be a printed circuit board, a ceramic substrate, or a semiconductor substrate. The substrate 500 may be a single substrate or a stacked substrate in which a plurality of layers are formed. For example, the substrate 500 may be a substrate on which a first layer 500a and a second layer 500b are stacked.

In one embodiment, the interconnections 505a, 505b, 505c, 505d, 505e, 505f, 505g, 505h, 507a, and 507b may be formed by plating. Alternatively, the interconnections 505a, 505b, 505c, 505d, 505e, 505f, 505g, 505h, 507a, and 507b may be formed by a deposition method.

An insulating material layer 510 having openings 510a and 510b exposing ends of the interconnections 505a, 505b, 505c, 505d, 505e, 505f, 505g, 505h, 507a, and 507b may be provided. For the purpose of clarity of description, a first opening 510a exposing an end of the first interconnection 507a and a second opening 510b exposing an end of the second interconnection 507b among the interconnections 505a, 505b, 505c, 505d, 505e, 505f, 505g, 505h, 507a, and 507b will be described below.

A first pad 515a filling the first opening 510a and having a greater width than the first opening 510a and a second pad 515b filling the second opening 510b and having a greater width than the second opening 510b may be provided on the insulating material layer 510.

While it is illustrated that the first and second openings 510a and 510b are formed in the same shape as the opening 10a of FIG. 3D, the disclosed embodiments are not limited thereto, and each of the first and second openings 510a and 510b may be formed in the same shape as one of the openings described with reference to FIGS. 5 to 16. Further, each end of the first and second interconnections 507a and 507b may be formed in the same shape as one of the ends of the interconnections described with reference to FIGS. 1 to 16 to correspond to the shape of each of the first and second openings 510a and 510b. Openings 510a and 510b may be formed in different shapes or sizes from each other, and similarly ends of interconnection 507a and 507b may also be formed in different shapes or sizes from each other.

Pads 515a and 515b filling the openings 510a and 510b and having greater widths than the openings 510a and 510b may be formed on the insulating material layer 510. Ball structures 520a and 520b may be formed on the pads 515a and 515b. The ball structures 520a and 520b may be solder balls.

The pads 515a and 515b may be formed by a printing process using a metal ink. For example, the pads 515a and 515b may be formed by performing a printing process using a metal ink containing metal particles or metal powders, forming first and second preliminary pads respectively covering the first and second openings 510a and 510b and spaced apart from each other, and performing a sintering process on the first and second preliminary pads.

The pads 515a and 515b may be disposed at a higher level than the interconnections 505a, 505b, 505c, 505d, 505e, 505f, 505g, 505h, 507a and 507b. A material constituting the pads 515a and 515b may have a lower density (i.e., weight or particles per volume) than that constituting the interconnections 505a, 505b, 505c, 505d, 505e, 505f, 505g, 505h, 507a and 507b. The pads 515a and 515b may have a greater roughness than the interconnections 505a, 505b, 505c, 505d, 505e, 505f, 505g, 505h, 507a, and 507b. Also, the particle size of the pads 515a and 515b may be greater than that of the interconnections 505a, 505b, 505c, 505d, 505e, 505f, 505g, 505h, 507a, and 507b.

In some embodiments, interconnections 555a and 555b including pad portions 560a and 560b may be provided on a second surface of the substrate 500. Here, the second surface of the substrate 500 may be opposite to the first surface of the substrate 500. The pad portions 560a and 560b and the interconnections 555a and 555b may be formed by plating. Alternatively, the pad portions 560a and 560b and the interconnections 555a and 555b may be formed by a deposition method such as CVD or PVD. Therefore, a material constituting the pads 515a and 515b on the first surface of the substrate 500 may exhibit a lower density, a greater particle size and a greater roughness than the material constituting the pad portions 560a and 560b on the second surface of the substrate 500. The pads 515a and 515b on the first surface of the substrate 500 may be electrically connected to the pad portions 560a and 560b on the second surface of the substrate 500 through vias 503a, 503b, 550a, and 550b in the substrate 500.

An insulating material layer 570 having openings 570a and 570b exposing predetermined regions of the pad portions 560a and 560b may be provided on the second surface of the substrate 500 having the pad portions 560a and 560b and the interconnections 555a and 555b. Ball structures 580a and 580b may be provided on the openings 570a and 570b.

In the embodiment of FIG. 17, more interconnections may be arranged on the first surface than the second surface of the substrate 500. An embodiment in which more interconnections may be arranged on both surfaces of a substrate will be described with reference to FIG. 18.

Figure 18:
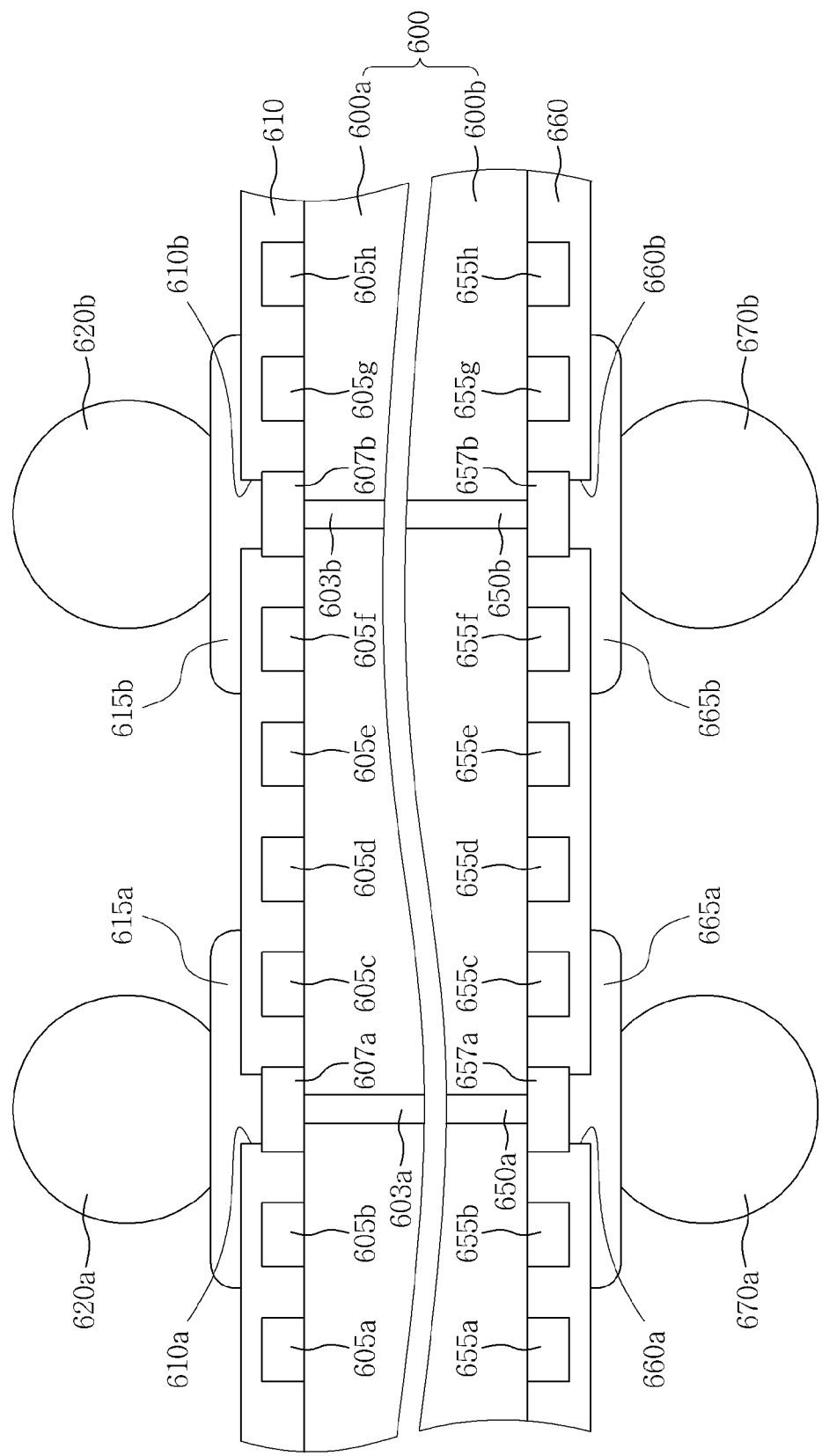
FIG. 18 is an exemplary cross-sectional view of an electronic device according to yet another embodiment of the inventive concept.

Referring to FIG. 18, as provided on the first surface of FIG. 17, a plurality of interconnections 605a, 605b, 605c, 605d, 605e, 605f, 605g, 605h, 607a, and 607b may be provided on a first surface of a substrate 600. The substrate 600 may be a printed circuit board, a ceramic substrate, or a semiconductor substrate, for example. The substrate 600 may be a single substrate or a stacked substrate in which a plurality of layers are formed. For example, the substrate 600 may be a substrate on which a first layer 600a and a second layer 600b are stacked.

An insulating material layer 610 having openings exposing ends of the interconnections 605a, 605b, 605c, 605d, 605e, 605f, 605g, 605h, 607a, and 607b may be provided. For the purpose of clarity of description, a first opening 610a exposing an end of the first interconnection 607a and a second opening 610b exposing an end of the second interconnection 607b among the interconnections 605a, 605b, 605c, 605d, 605e, 605f, 605g, 605h, 607a, and 607b will be illustrated in FIG. 18.

A first pad 615a filling the first opening 610a and having a greater width than the first opening 610a and a second pad 615b filling the second opening 610b and having a greater width than the second opening 610b may be provided on the insulating material layer 610.

Pads 615a and 615b filling the openings 610a and 610b and having greater widths than the openings 610a and 610b may be formed on the insulating material layer 610. Ball structures 620a and 620b may be formed on the pads 615a and 615b, respectively.

Interconnections 655a, 655b, 655c, 655d, 655e, 655f, 655g, 655h, 657a, and 657b, an insulating material layer 660 having openings 660a and 660b, pads 665a and 665b, and ball structures 670a and 670b may be formed on a second surface of the substrate 600. The interconnections 655a, 655b, 655c, 655d, 655e, 655f, 655g, 655h, 657a, and 657b, the insulating material layer 660 having the openings 660a and 660b, the pads 665a and 665b, and the ball structures 670a and 670b on the second surface of the substrate 600 may correspond to the interconnections 605a, 605b, 605c, 605d, 605e, 605f, 605g, 605h, 607a, and 607b, the insulating material layer 610 having the openings 610a and 610b, the pads 615a and 615b, and the ball structures 620a and 620b on the first surface of the substrate 600, respectively.

Figure 19:
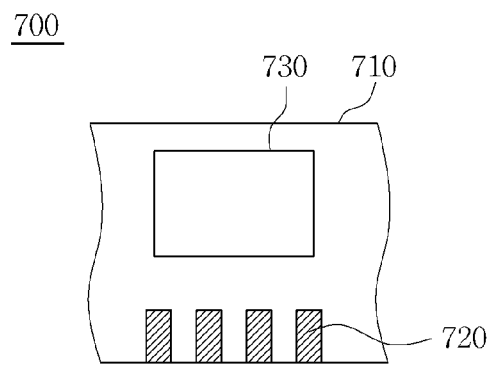
FIGS. 19 to 21 are exemplary schematic diagrams of a semiconductor module including an electronic device, an electronic circuit board and an electronic system according to the embodiments of the inventive concept.

FIG. 19 is a schematic diagram of an exemplary semiconductor module in which a method and device according to at least one of the embodiments are used.

Referring to FIG. 19, a semiconductor module 700 includes a module substrate 710, one or more semiconductor devices 730 disposed on the module substrate 710, and module connection terminals 720 formed in parallel at one edge of the module substrate 710 and electrically connected to the semiconductor devices 730. Here, the semiconductor device 730 may be, for example, a semiconductor chip, semiconductor package, or package-on-package device.

The module substrate 710 may be a PCB. Both surfaces of the module substrate 710 may be used. That is, the semiconductor devices 730 may be disposed on front and rear surfaces of the module substrate 710. Interconnections, an insulating material layer having openings, and pads according to embodiments of the inventive concept may be provided on the front and rear sides of the module substrate 710, and the semiconductor device or semiconductor package 730 may be electrically or mechanically connected to the module substrate 710 through the pads and ball structures on the pads.

The module connection terminals 720 may be formed of a metal and may have oxidation resistance. The module connection terminals 720 may be variously set depending on the standard of the semiconductor module 700. Therefore, the number of module connection terminals 720 is not significant.

Figure 20:
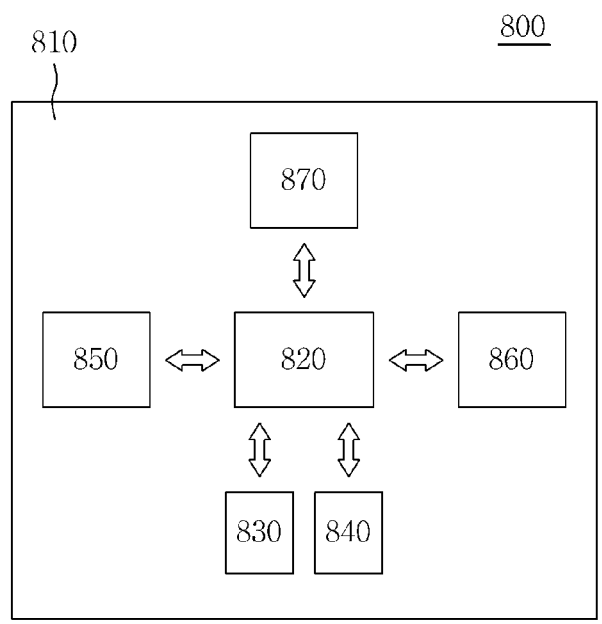

FIG. 20 is an exemplary schematic block diagram of an electronic circuit board in which a method and device according to at least one of the embodiments are used. Referring to FIG. 20, an electronic circuit board 800 in which a method and device according to at least one of the embodiments are used may be provided. The electronic circuit board 800 includes a microprocessor 820 disposed on a circuit board 810, a main storage circuit 830 and a supplementary storage circuit 840 communicating with the microprocessor 820, an input signal processing circuit 850 transmitting a command to the microprocessor 820, an output signal processing circuit 860 receiving the command from the microprocessor 820 and a communicating signal processing circuit 870 transmitting and receiving an electrical signal to/from other circuit boards. It may be understood that arrows denote a route by which an electrical signal may be transferred.

The microprocessor 820 may receive and process various electrical signals, output the results, and control the other elements of the electronic circuit board 800. For example, it may be understood that the microprocessor 820 corresponds to a central processing unit (CPU) and/or a main control unit (MCU). The main storage circuit 830 may temporarily store data that the microprocessor 820 always or frequently requires or data before and after processing. In one embodiment, the main storage circuit 830 requires a high-speed response, and thus may be formed of a semiconductor memory. More specifically, the main storage circuit 830 may be formed of a semiconductor memory referred to as a cache, a static random access memory (SRAM), a dynamic random access memory (DRAM), a resistive random access memory (RRAM) and applied semiconductor memories thereof, e.g., Utilized RAM, Ferro-electric RAM, Fast cycle RAM, Phase changeable RAM, Magnetic RAM, and other semiconductor memories. Furthermore, the main storage circuit 830 is not necessarily related to a volatile/non-volatile memory circuit, and may include a random access memory.

The main storage circuit 830 may include at least one semiconductor module 700. The supplementary storage circuit 840 is a high-capacity memory device, and may be a non-volatile semiconductor memory such as a flash memory or a hard disk drive using a magnetic field. Alternatively, it may be a compact disk drive using light. In one embodiment, compared to the main storage circuit 830, the supplementary storage circuit 840 does not require high speed, but may be used to store high-capacity data.

The supplementary storage circuit 840 is not necessarily related to random/non-random memory, and may include a non-volatile memory device. The supplementary storage circuit 840 may include at least one semiconductor module 700. The input signal processing circuit 850 may convert an external command into an electrical signal or transfer an externally received electrical signal to the microprocessor 820. The externally received command or electrical signal may be an operation command, an electrical signal to be processed or data to be stored. The input signal processing circuit 850 may be, e.g., a terminal signal processing circuit processing a signal transmitted from a keyboard, a mouse, a touch pad, an image recognition device or various sensors, an image signal processing circuit processing an input of an image signal from a scanner or a camera, or various sensors or input signal interfaces.

The output signal processing circuit 860 may be an element for externally transmitting an electrical signal processed by the microprocessor 820. For example, the output signal processing circuit 860 may be a graphics card, an image processor, an optical converter, a beam panel card, or an interface circuit of various functions. The communicating signal processing circuit 870 is an element for directly transmitting or receiving an electrical signal to/from other electronic systems or other circuit boards without using the input signal processing circuit 850 and the output signal processing circuit 860. For example, the communicating circuit 870 may be a modem of a personal computer system, a LAN card or various interface circuits. The pads, ball structures, and interconnections disclosed herein may be used as connections for the circuits of circuit board 800.

Figure 21:
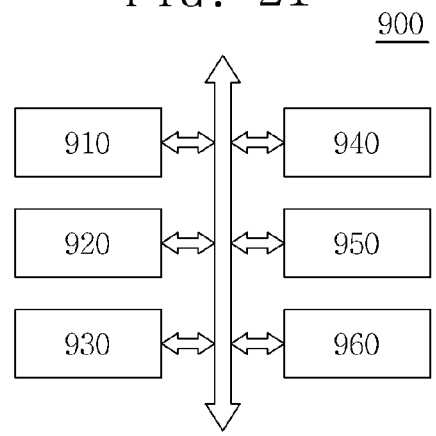

FIG. 21 is an exemplary schematic block diagram of an electronic system in which a method and device according to at least one of the embodiments are used.

Referring to FIG. 21, an electronic system 900 according to an embodiment may further include a control unit 910, an input unit 920, an output unit 930, a storage unit 940, a communication unit 950 and/or an operation unit 960.

The control unit 910 may generally control the electronic system 900 and each unit. The control unit 910 may be understood as a central processing unit or a central control unit, and may include the electronic circuit board 800. The input unit 920 may transmit an electrical command signal to the control unit 910. The input unit 920 may be a keyboard, a keypad, a mouse, a touch pad, an image recognition device such as a scanner or various input sensors.

The output unit 930 may receive an electrical command signal from the control unit 910, and may output the result processed by the electronic system 900. The output unit 930 may be a monitor, a printer, a beam irradiator or various mechanical devices. The storage unit 940 may be an element for temporarily or permanently storing an electrical signal to be processed or processed by the control unit 910. The storage unit 940 may be physically or electrically combined with the control unit 910. The storage unit 940 may be a semiconductor memory, a magnetic memory device such as a hard disk, an optical storage device such as a compact disk or a server having a data storage function. The communication unit 950 may receive an electrical command signal from the control unit 910 and may transmit or receive the received electrical signal to/from other electronic systems. The communication unit 950 may be a wired transceiver such as a modem and a LAN card, a wireless transceiver such as WiBro interface or an infrared port. The operation unit 960 may physically or mechanically operate according to the command of the control unit 910. For example, the operation unit 960 may be an element that mechanically operates such as a plotter, an indicator, or an up/down operator. The electronic system according to an embodiment of the inventive concept may be a computer, a network server, a networking printer or scanner, a wireless controller, a mobile communication terminal, an exchanger or an electronic product that performs programmed operations. The pads, ball structures, and interconnections disclosed herein may be used as connections within the electronic system 900.

Figure 22:
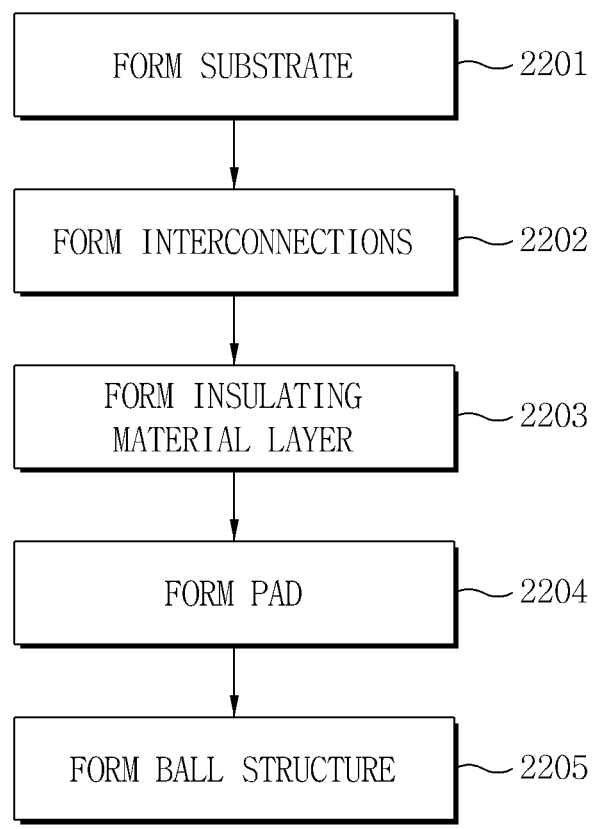
FIG. 22 is a flow chart depicting an exemplary method of forming an electronic device according to certain embodiments of the inventive concept.

FIG. 22 is a flow chart depicting an exemplary method of manufacturing an electronic device, according to certain embodiments.

In step 2201, a substrate is formed. The substrate may be, for example, a printed circuit board, ceramic substrate, or semiconductor substrate.

In step 2202, interconnections are formed on the substrate. The interconnections may include a plurality of interconnections formed of a conductive material by, for example, plating, a deposition method such as chemical vapor deposition or physical vapor deposition, or using a bonding film. The interconnections may be formed having a first density (e.g., a first weight or number of particles per volume).

In step 2203, an insulating material layer is formed on the substrate. The insulating material may be a resist layer, such as a photosensitive solder resist material. The insulating material layer may be formed on the substrate to cover and insulate the interconnections, except that certain portions of the insulating material layer may include an opening exposing a portion of the interconnections. For example, in one embodiment, one or two ends of an interconnection may coincide with an opening formed in the insulating material layer, so that the one or two ends are exposed outside the insulating material layer.

In step 2204, a pad is formed on the substrate, over the opening. The pad may fill the opening and contact the interconnection to form an electrical and mechanical connection with the interconnection. In one embodiment, the pad is formed using an ink containing metal, and using a sintering process. The pad may be formed to contact the interconnection only at a top surface, or may contact the top surface as well as one or more sidewalls of the interconnection. The pad may be formed to completely fill the opening and to extend above the top surface of the insulating material layer and be wider than the opening. The pad may cover the end of the interconnection, and also cover portions of adjacent interconnections, while being insulated from the adjacent interconnections by the insulating material layer. In one embodiment, the pad is formed to have a second density lower than the first density of the interconnection. That is, the interconnection material may be formed of smaller, more densely packed particles than the pad, such that the pad has more and/or larger spaces between adjacent particles than the interconnection.

In step 2205, a ball structure is formed on the pad. The ball structure may be formed by a soldering process, and may be used to connect the substrate to a chip, package, or other substrate.

According to embodiments of the inventive concept, a PCB or other substrate can be manufactured having an increased number of interconnections. To do so, pads can be formed on a substrate to connect to respective interconnections, and may fill respective openings in an insulating material layer. Portions of the pads may be wider than the openings. Foe example, in one embodiment, each pad may be raised above the top surface of the insulating material layer, and may cover at least a part of interconnections adjacent to the interconnection to which the pad is connected. The pads can be formed using a simple process, such as using ink and sintering, without the need for a lithography process. Integration density of an electronic device can therefore be increased.

According to embodiments of the inventive concept, interconnections and pads disposed at a different level from the interconnections can be provided. Further, since more interconnections can be disposed between the pads, integration density of the interconnections can be increased. Also, a method of increasing a contact area between the pads and the interconnections is provided, and thus electrical and mechanical connection of the pads and the interconnections can be stably made.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive disclosure as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. An electronic device, comprising:
   first and second interconnections formed at a same vertical height on a first surface of a substrate and spaced apart from each other;
   a first insulating material layer disposed on the substrate including the first and second interconnections and including a first opening exposing a predetermined region of the first interconnection; and
   a first pad filling the first opening and having a greater width than the first opening, wherein the first pad vertically overlaps at least a part of the second interconnection adjacent to one end of the first interconnection, and the first pad is electrically insulated from the second interconnection by the first insulating material layer.

2. The device of claim 1, wherein the first opening exposes an upper portion of one end of the first interconnection.

3. The device of claim 1, wherein the first opening exposes an upper portion and sidewall of one end of the first interconnection.

4. The device of claim 1, wherein the first opening is formed in a rectangular or oval shape having a major axis and a minor axis.

5. The device of claim 1, wherein the first interconnection has an end including a bent portion, and the first opening exposes an upper portion of the bent portion of the first interconnection.

6. The device of claim 1, wherein the first pad has a flat top surface that is raised above a top surface of the first insulating material layer.

7. The device of claim 1, wherein the first pad has one of a swollen central portion or a recessed top surface.

8. The device of claim 1, wherein the first insulating layer has a second opening exposing a predetermined region of the second interconnection, the electronic device further comprises a second pad filling the second opening, having a greater width than the second opening, and formed of the same material as the first pad, and when viewed from a plan view, a center point of the first opening is at a position not coincident with a center point of the first pad and a center point of the second opening overlaps a center point of the second pad.

9. An electronic device, comprising:
first and second interconnection formed on a first surface of a substrate and spaced apart from each other;
a first insulating material layer disposed on the substrate including the first and second interconnections and including a first opening exposing a predetermined regionn of the first interconnection; and
first pad filling the first opening and having a greater width than the first opening, wherein the first covers at least a part of the second interconnection adjacent to one end of the first interconnection, and the first pad is electrically insulated from the second interconnection by the first insulating material layer,
wherein the first and second interconnections are formed of a first conductive material and the first pad is formed of a second conductive material having a lower density than the first conductive material.

10. The device of claim 1, wherein the first pad covers the one end of the first interconnection exposed by the first opening, extends to cross over the second interconnection adjacent to the one end of the first interconnection to cover the second interconnection, and is insulated from the second interconnection by the first insulating material layer.

11. The device of claim 1, wherein the one end of the first interconnection has the same width as or a greater width than a middle portion of the first interconnection.

12. The device of claim 1, wherein the first insulating layer has a second opening exposing a predetermined region of the second interconnection,
the electronic device further comprises a second pad filling the second opening, and when viewed from a plan view, the first and second openings have different shapes or sizes from each other.

13. The device of claim 1, further comprising a second pad connected to the second interconnection,
wherein the first and second pads are pads formed by sintering a solution containing metal particles or metal powders and have a first particle size, and the first and second interconnections are interconnections formed of a conductive material having a second particle size formed by plating or depositing, the second particle size being smaller than the first particle size.

14. The device of claim 1, further comprising a second pad connected to the second interconnection,
wherein the first and second pads have surfaces or cross-sections having a greater roughness than those of the first and second interconnections.

15. The device of claim 1, further comprising:
a second pad connected to the second interconnection;
third and fourth pads formed on a second surface of the substrate opposite to the first surface and spaced apart from each other;
a second insulating material layer formed on the second surface of the substrate having the third and fourth pads, and having third and fourth openings respectively exposing the third and fourth pads;
first and second ball structures formed on the first and second pads; and
third and fourth ball structures formed on the third and fourth pads,
wherein a material constituting the first and second pads has a lower density than a material constituting the third and fourth pads.

16. An electronic device, comprising:
a substrate;
an interconnection formed on the substrate;
an insulating material layer covering the substrate having the interconnection and including an opening exposing a predetermined region of the interconnection;
a pad filling the opening, at least a portion of the pad having a greater width than a width of the predetermined region of the interconnection and being electrically connected to the interconnection; and
a ball structure on the pad,
wherein the pad is formed by coating a liquid-phase material containing metal particles or metal powders to cover the opening, and performing a sintering process for solidifying the coated material at a lower temperature than a melting point of the metal particles or metal powders, and
wherein interconnection is formed of a conductive material that has more densely packed particles than the solidified material that comprise the pad.

17. The device of claim 1, wherein the first and second interconnections are formed of a first conductive material and the first pad is formed of a second conductive material having a lower density than the first conductive material.

18. The electronic device of claim 16, further comprising:
an additional interconnection formed at a same vertical height on the substrate as the interconnection and spaced apart from the interconnection,
wherein the pad vertically overlaps at least a part of the additional interconnection.

* * * * *